United States Patent
Hayakawa et al.

(10) Patent No.: US 10,177,296 B2
(45) Date of Patent: Jan. 8, 2019

(54) THERMOELECTRIC CONVERSION ELEMENT AND THERMOELECTRIC CONVERSION MODULE USING SAME

(75) Inventors: Jun Hayakawa, Tokyo (JP); Yosuke Kurosaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 1239 days.

(21) Appl. No.: 14/238,489

(22) PCT Filed: Sep. 5, 2011

(86) PCT No.: PCT/JP2011/070181
§ 371 (c)(1),
(2), (4) Date: Feb. 12, 2014

(87) PCT Pub. No.: WO2013/035148
PCT Pub. Date: Mar. 14, 2013

(65) Prior Publication Data
US 2014/0209142 A1  Jul. 31, 2014

(51) Int. Cl.
*H01L 37/00* (2006.01)

(52) U.S. Cl.
CPC .................. *H01L 37/00* (2013.01)

(58) Field of Classification Search
CPC ..... H01L 29/4908; H01L 43/08; H01L 37/00; H01L 35/00; H01L 35/04; H01L 35/28;
(Continued)

(56) References Cited

U.S. PATENT DOCUMENTS

2007/0034245 A1*  2/2007  Nakajima ............... C22C 12/00
                                                                 136/205
2010/0276770 A1* 11/2010  Uchida .................... G01K 7/36
                                                                 257/421
(Continued)

FOREIGN PATENT DOCUMENTS

JP         2009-130070 A       6/2009

OTHER PUBLICATIONS

T Kubota, M Oogane, S Mizukami, H Naganuma, Y Ando and T Miyazaki, "Magnetoresistance effect in co2mnsi/semimetallic-Fe2VAl/CoFe junctions", 2010, Journal of Physics: Conference Series, vol. 266, pp. 1-5.*

(Continued)

*Primary Examiner* — Mayla Gonzalez Ramos
(74) *Attorney, Agent, or Firm* — Miles & Stockbridge PC

(57) ABSTRACT

Provided is a thermoelectric conversion element having a greater Seebeck coefficient (S) than the conventional ones. In a thermoelectric conversion element: a nonmagnetic Heusler alloy film (10), a ferromagnetic Heusler alloy film (11) and a nonmagnetic layer (12) are stacked in the named order; a pair of electrodes (23, 24) are disposed for deriving, in accordance with a temperature gradient occurring in parallel to the direction of magnetization (41) of the ferromagnetic Heusler alloy film, an electromotive force occurring perpendicularly to the direction of magnetization of the ferromagnetic Heusler alloy film; a pair of electrodes (21, 22) are disposed for deriving an electromotive force occurring in parallel to the direction of magnetization of the ferromagnetic Heusler alloy film; and the electromotive forces occurring due to an ordinary Seebeck effect and a spin Seebeck effect are simultaneously derived.

8 Claims, 4 Drawing Sheets

(58) Field of Classification Search
CPC ..... H01L 35/30; H01L 35/32; H01L 31/0392; H01L 31/0525; H01L 31/0547; H01L 31/056; H01L 31/06
See application file for complete search history.

(56) References Cited

U.S. PATENT DOCUMENTS

2011/0084349 A1* 4/2011 Uchida .............. C01G 49/0054
257/421
2012/0280338 A1* 11/2012 Abraham .............. H01L 27/222
257/421

OTHER PUBLICATIONS

C.S. Lue, "Thermal and transport properties of the Heusler-type compounds $Fe_{2-x}Ti_{1+x}Sn$", 2004, Journal of Applied Physics 96, 2681.*

U. Geiersbach, A. Bergmann, K. Westerholt, "Structural, magnetic and magnetotransport properties of thin films of the Heusler alloys Cu2MnAl, Co2MnSi, Co2MnGe and Co2MnSn", Journal of Magnetism and Magnetic Materials vol. 240, Issues 1-3, Feb. 2002, pp. 546-549.*

* cited by examiner

TEMPERATURE GRADIENT DIRECTION

TEMPERATURE GRADIENT DIRECTION

TEMPERATURE GRADIENT DIRECTION

TEMPERATURE GRADIENT DIRECTION

TEMPERATURE GRADIENT DIRECTION

THERMOELECTRIC CONVERSION ELEMENT AND THERMOELECTRIC CONVERSION MODULE USING SAME

TECHNICAL FIELD

The present invention concerns a thermoelectric conversion element having a high conversion efficiency and a thermoelectric conversion module using the same.

BACKGROUND

Conversion of a thermal energy into an electric energy by utilizing a Seebeck effect of a material is referred to as thermoelectric conversion and a device realizing the thermoelectric conversion is a thermoelectric conversion element. The material used for the thermoelectric conversion element is referred to as a thermoelectric conversion material and there is an index for evaluating the efficiency of thermoelectric conversion: $Z=S^2\sigma/\kappa$, in which S is a Seebeck coefficient, $\sigma$ is an electric conductivity, and $\kappa$ is a thermal conductivity.

Thermoelectric conversion materials known so far include the followings.
(1) Semiconductor compounds such as Bi—Te, Si—Ge, and Zn—Sb, and compounds having a Skutterudite structure.
(2) Oxides typically represented by $NaCoO_2$.
(3) Compounds having a half-Heusler structure such as ZrNiSn.

The Seebeck effect occurring in the materials described above is a phenomenon that electric charges move by a temperature gradient to generate current or voltage. On the other hand, patent document 1 discloses a Seebeck effect that occurs when a temperature gradient exerts on a spin to generate a current. When a thermal gradient is applied to a general ferromagnetic material such as NiFe, up-spin and down-spin in NiFe form currents in the directions opposite to each other relative to the direction of the temperature gradient. Then, when a material film such as Pt having a large spin-orbit interaction is attached to one of ends in the direction of the temperature gradient of the ferroelectric material, voltage (current) is generated in a direction perpendicular to the temperature gradient in Pt. This is referred to as a spin Seebeck effect.

CITATION LIST

Patent Literature

Patent Literature 1: Japanese Unexamined Patent Publication No. 2009-130070

SUMMARY OF THE INVENTION

Technical Problem

In the existent materials enumerated above, the electric conductivity and the Seebeck coefficient were limited. A performance index necessary for putting a thermoelectric conversion element into practical use is defined by ZT (T represents absolute temperature), and at least 1 or more, preferably, 2 or more ZT is necessary. It was difficult to attain a further higher conversion efficiency in thermoelectric conversion elements by utilizing the usual Seebeck effect. In addition, the electromotive force utilizing the spin Seebeck effect is not sufficiently high compared with the electromotive force obtained by usual Seebeck effect and a thermoelectric conversion element of large efficiency cannot be provided by the spin Seebeck alone.

The present invention intends to provide a thermoelectric conversion element having a larger Seebeck coefficient S than usual and a thermoelectric conversion module comprising the thermoelectric conversion element.

Solution to Problem

In the thermoelectric conversion element according to the present invention, a first non-magnetic film, a ferromagnetic film, and a second non-magnetic film are stacked in this order over a substrate, and the element comprises a first electrode pair for deriving a first electromotive force generated in a direction perpendicular to the direction of magnetization of the ferromagnetic film due to a temperature gradient parallel to the direction of magnetization of the ferromagnetic film and a second electrode pair for deriving a second electromotive force generated in a direction parallel to the direction of magnetization of the ferromagnetic film. The first electrode pair is formed over the second non-magnetic film.

The first electromotive force is an electromotive force generated by the spin Seebeck effect and the second electromotive force is an electromotive force generated by the usual Seebeck effect. The thermoelectric conversion element of the invention enables to derive two types of the electromotive forces simultaneously. It is preferred to use a non-magnetic Heusler alloy film for the first non-magnetic film and a ferromagnetic Heusler alloy film capable of increasing the spin Seebeck effect for the ferromagnetic film.

Advantageous Effect of Invention

According to the present invention, larger Seebeck coefficient than usual can be attained.

Other subjects, constitutions, and effects than those described above will become apparent by reference to the description of the following embodiments.

DESCRIPTION OF EMBODIMENTS

Preferred embodiments of the present invention are to be described with reference to the drawings.

Figure 1:
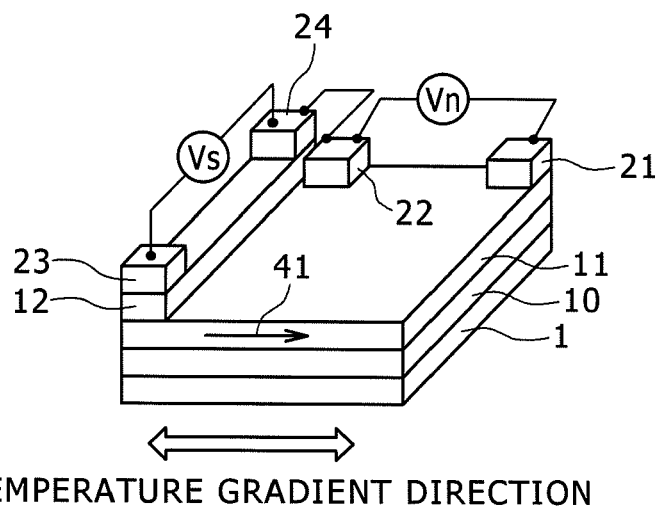
FIG. 1 is a schematic view illustrating an embodiment of a thermoelectric conversion element according to the present invention.

FIG. 1 is a schematic view illustrating an embodiment of a thermoelectric conversion element according to the present invention. In the thermoelectric conversion element, a nonmagnetic Heusler alloy film 10 and a ferromagnetic Heusler alloy film 11 are stacked in this order over a substrate 1 of a low thermal conductivity and, further, a non-magnetic film 12 is provided over the ferromagnetic Heusler alloy film 11.

Instead of the non-magnetic Heusler alloy film, non-magnetic films comprising semiconductor compounds such as Bi—Te, Si—Ge, Zn—Sb, etc., compounds having a Skutterudite structure, oxides typically represented by $NaCoO_2$, or compounds having a half-Heusler structure such as ZrNiSn which are thermoelectric conversion materials known so far may also be used. Further, instead of the ferromagnetic film Heusler alloy film, ferromagnetic films comprising Co, Fe, or Ni or alloys containing such elements, etc. may also be used. However, in the invention, a particularly large effect can be obtained when using the non-magnetic Heusler alloy film as the non-magnetic film and using the ferromagnetic Heusler alloy film as the ferromagnetic film. Accordingly, the present invention is to be described hereinafter with respect to embodiments using the non-magnetic Heusler alloy film as the non-magnetic film and the ferromagnetic Heusler alloy film as the ferromagnetic film.

The non-magnetic film 12 is arranged within a film surface on one of ends in the direction of a temperature gradient of the ferromagnetic Heusler alloy film (blank arrows in the drawing) so as to be perpendicular to the temperature gradient. A pair of electrodes 23 and 24 are provided over the non-magnetic film 12 for deriving electromotive force Vs generated on both ends of the non-magnetic film 12. On the other hand, a pair of electrodes 21 and 22 are provided being spaced apart from each other in the direction of the temperature gradient over the ferromagnetic Heusler alloy film 11 for deriving an electromotive force Vn generated in the direction of the temperature gradient of the thermoelectric conversion element. The electrode 22 and the electrode 24 are electrically connected to each other. Alternatively, the electrode 22 and the electrode 24 may be in an integrated structure.

Figures 5, 6:
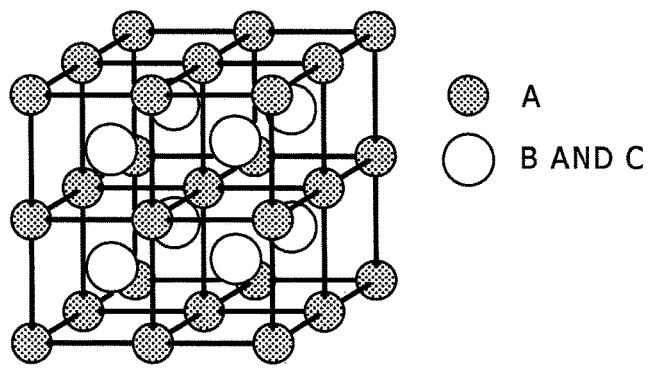
FIG. 5 is a schematic view of a Heusler structure.
FIG. 6 is a view illustrating a portion of a periodic table.

Both of the non-magnetic Heusler alloy film 10 and the ferromagnetic Heusler alloy film 11 have a crystal structure $B_2$ or $L2_1$ as shown in FIG. 5 represented by $A_2BC$. The $B_2$ structure is a structure in which elements B and C are arranged at random and, on the other hand, the $L2_1$ structure is a structure in which elements B and C are arranged orderly. In the expression $A_2BC$, elements used for A, B, and C are as described below (refer to FIG. 6).

A: Elements (Mn, Fe, Co, Ni, Tc, Ru, Rh, Pd, Re, Os, Ir, and Pt) belonging to the element group 7 to the element group 10 in the fourth period to the sixth period of the periodic table, and comprising single element or two or more of plural elements thereof.

B: Elements (Ti, V, Cr, Mn, Zr, Nb, Mo, Tc, Hf, Ta, W and Re) belonging to the element group 4 to the element group 7 in the fourth period to the sixth period of the periodical table, and comprising single element or two or more of plural elements thereof.

C: Elements (Al, Si, Ga, Ge, In, Sn, Tl, and Pb) belonging to the element group 13 to the element group 14 in the third period to the sixth period of the periodic table, and comprising single element or two or more of plural elements thereof.

As the non-magnetic Heusler alloy 10, $Fe_2VAl$, $Fe_2TiSn$, $Fe_2VSi$, etc. can be selected as materials of large Seebeck coefficient. Further, as the ferromagnetic Heusler alloy film 11 capable of increasing the spin Seebeck coefficient, CoMnSi, FeMnSi, etc. are selected. When the non-magnetic Heusler alloy film 10 and the ferromagnetic Heusler alloy film 11 are formed, a $B_2$ or $L2_1$ structure can be formed stably by heating the substrate at 300° C. or higher or by applying a heat treatment at 300° C. or higher after film formation. For the non-magnetic film 12, it is necessary to use an element having a large spin-orbit interaction such as Pt, Pd, and Ir. For the electrodes, a material of low specific resistivity such as Au, Cu or Al is used. The planar size of the thermoelectric conversion element prepared by using such a material can be, for example, from several μm to several mm.

In the thermoelectric conversion element of this embodiment, the pair of the electrodes 21 and 22 can derive the thermoelectromotive force Vn due to the usual Seebeck effect occurring within the film in which the non-magnetic Heusler alloy 10 and the ferromagnetic Heusler film 11 are stacked in this order. On the other hand, the pair of the electrodes comprising the electrode 23 and the electrode 24 can derive the electromotive force Vs due to the spin Seebeck effect occurring in the ferromagnetic Heusler alloy film 11 by way of the non-magnetic film 12. Since the thermoelectromotive force due to the spin Seebeck effect is generated in the direction perpendicular to the direction of magnetization of the ferromagnetic film, it is necessary to set the direction of magnetization 41 of the ferromagnetic Heusler alloy film 11 so as to be directed in the parallel direction within the film plane relative to the temperature gradient applied to the thermoelectric conversion element. Further, since the voltage generated in the non-magnetic film 12 in contact with the ferromagnetic Heusler alloy film 11 is derived, the ferromagnetic Heusler alloy film 11 and the non-magnetic film 12 have to be in contact to each other. In view of the above, it is necessary that the Heusler alloy film 10, the ferromagnetic Heusler alloy film 11, and the non-magnetic film 12 are stacked in this order.

In the thermoelectric conversion element manufactured as described above, respective pair of the electrodes are connected so as to serially derive the voltage Vn generated between the electrodes 21 and 22 and the voltage Vs generated between the electrodes 23 and 24. Thus, electromotive forces Vn+Vs are derived from the electrode 21 and the electrode 23. The electrode 11 is arranged so as to derive a voltage parallel to the direction of the temperature gradient between the electrode 23 and the electrode 24. On the other hand, the electrode 24 is arranged so as to derive a voltage perpendicular to the direction of the temperature gradient between the electrode 23 and the electrode 24. The electrode 23 and the electrode 24 may be arranged at either end of the element. By using a material such as $Fe_2VAl$ or $Fe_2TiSn$ for the non-magnetic Heusler alloy film and a material such as CoMnSi or FeMnSi for the ferromagnetic Heusler alloy film 11, a thermoelectromotive force twice as large as the thermoelectromotive force generated in an existent single material film can be derived.

Figure 2:
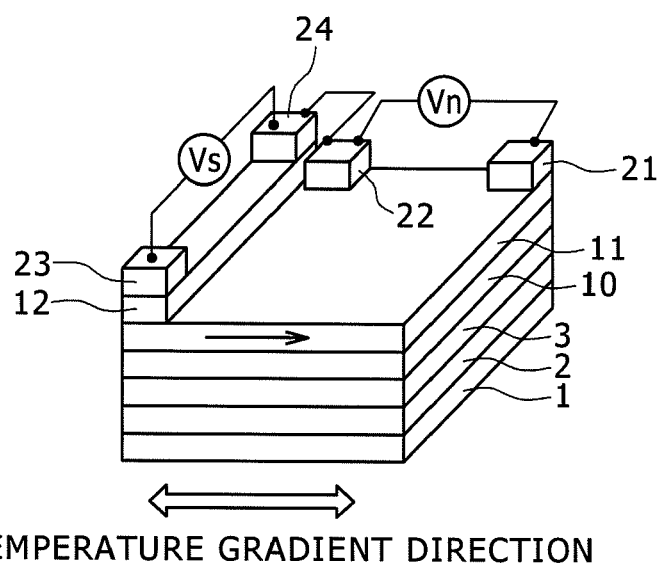
FIG. 2 is a schematic view illustrating other embodiment of the thermoelectric conversion element according to the present invention.

FIG. 2 is a schematic view illustrating other embodiment of the thermoelectric conversion element according to the invention. The thermoelectric conversion element in this embodiment is different from the thermoelectric conversion element illustrated in FIG. 1 in that a buffer layer 2 and a seed layer 3 are interposed between the substrate 1 and the non-magnetic Heusler alloy film 10. For obtaining a larger Seebeck coefficient, it is necessary that the non-magnetic Heusler alloy film and the ferromagnetic Heusler alloy have a stable $B_2$ or $L2_1$ structure. For this purpose, it is desirable to use a material having a body-centered (BCC) structure such as V, Cr, and W, or MgO, MgZnO, etc. of a rock salt structure as the seed layer 3. Further, for obtaining the seed layer 3, the buffer layer 2 is provided preferably and Ta, Ru, Ti, Zr, etc. are used for the buffer layer 2. As a result, the electromotive forces Vn and Vs can be increased and twice (100 μV/K) or more thermoelectromotive force than that in the usual case can be derived.

Figure 3:
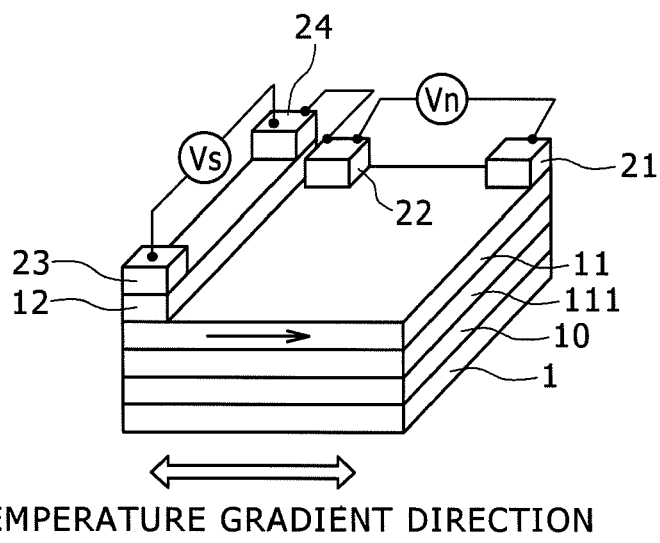
FIG. 3 is a schematic view illustrating other embodiment of the thermoelectric conversion element according to the present invention.

FIG. 3 is a schematic view illustrating other embodiment of the thermoelectric conversion element according to the invention. The thermoelectric conversion element of this embodiment is different from the thermoelectric conversion element illustrated in FIG. 1 in that an anti-ferromagnetic film 111 is interposed between the non-magnetic Heusler alloy film 10 and the ferromagnetic Heusler alloy film 11. By using the anti-ferromagnetic film 111, the direction of magnetization of the ferromagnetic Heusler alloy film 11 can be fixed intensely in one direction. Vs depends on the direction of magnetization of the ferromagnetic Heusler alloy film and increases as the direction of magnetization thereof is aligned more uniformly in one direction. Accordingly, Vs can be increased further by arranging the anti-ferromagnetic film 111 in adjacent to the ferromagnetic Heusler alloy film 11 and intensely fixing the direction of magnetization of the ferromagnetic Heusler alloy film 11 in one direction. For the anti-ferromagnetic film 111, films comprising, for example, MnIr, MnPt, CrMnIr and, further, films having a Heusler structure represented by $A_2BC$ are used. For each of the elements of the $A_2BC$ structure, elements having the anti-ferromagnetic property are selected from the elements described below.

A: Elements belonging to the element group 7 to the element group 10 in the forth period to the sixth period of the periodic table and comprising a single element or two or more plural elements thereof.

B: Elements belonging to the element group 4 to the element group 6 in the fourth period to the sixth period of the periodic table and comprising a single element thereof or two or more plural elements thereof.

C: Elements belonging to the element group 13 and the element group 14 in the third period to the seventh period of the periodic table and comprising a single element or two or more plural elements thereof.

As the anti-ferromagnetic film having the Heusler structure, $Ru_2MnSi$, $Fe_2VSi$, etc. can be used.

Figure 4:
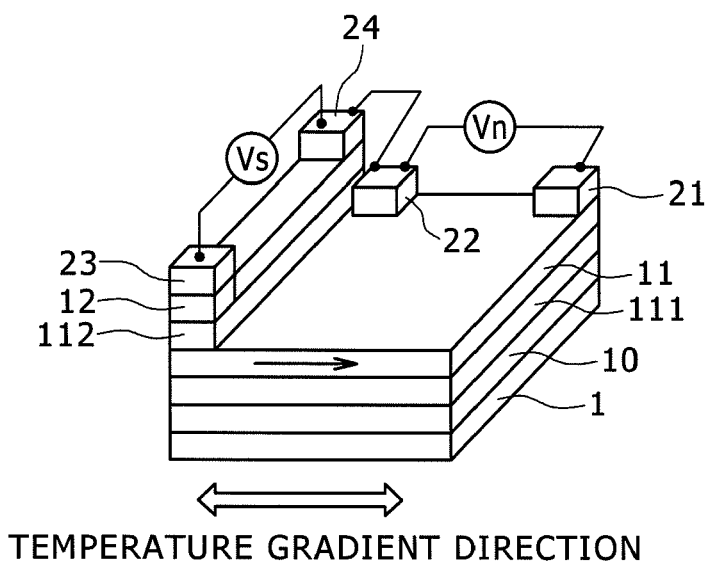
FIG. 4 is a schematic view illustrating other embodiment of a thermoelectric conversion element according to the present invention.

FIG. 4 is a schematic view showing other embodiment of the thermoelectric conversion element of the invention. The thermoelectric conversion element of this embodiment is different from the thermoelectric conversion element illustrated in FIG. 1 in that a tunnel barrier film 112 is interposed between the ferromagnetic Heusler alloy film 11 and the non-magnetic film 12. For the tunnel barrier film 112, materials such as MgO, MgZnO, and MgAlO that can permeate and transmit one of up-spin or down-spin of the ferromagnetic Heusler alloy film to the non-magnetic film 12 at a good selectivity and efficiently are selected. By improving the selectivity of spin permeation, the electromotive force Vs can be increased further and can be improved twice or more compared with the existent electromotive force.

Figure 7:
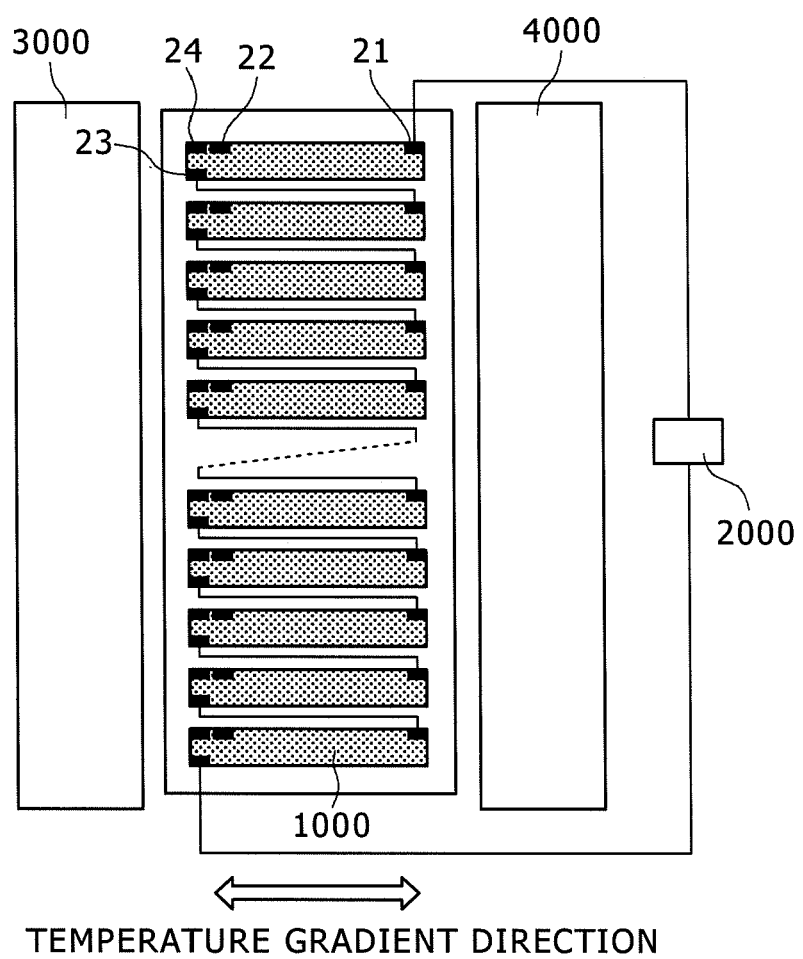
FIG. 7 is a schematic plan view illustrating an example of a thermoelectric conversion module according to the present invention.

A thermoelectric conversion module using the thermoelectric conversion element of the invention can be realized. FIG. 7 is a schematic plan view illustrating an example of a thermoelectric conversion module using thermoelectric conversion elements 1000 of the invention.

The thermoelectric conversion module has a plurality of thermoelectric conversion elements 1000 in which each of the thermoelectric conversion elements 1000 is arranged such that the electrodes 21 and 22 are in parallel to the temperature gradient and the electrodes 23 and 24 are in perpendicular to the temperature gradient. When the electrode 21 and the electrode 23 of each of the thermoelectric conversion elements 1000 are connected, the thermal electromotive forces of the entire thermoelectric conversion elements are derived serially in a voltage meter 2000. When a heat source is disposed at 3000, a heat dissipation source is disposed at 4000. An air cooling system using heat dissipation fins or a water cooling system by providing a cooling water pipeline may be used on the heat dissipation side. Since the thermoelectric conversion element of the invention can improve the Seebeck coefficient to twice or more than that of the usual element, a power factor four times as large as the existent case can be realized also in the thermoelectric conversion module comprising a plurality of the thermal conversion elements in combination. The shape of the thermoelectric conversion module is designed so as to provide an arrangement capable of obtaining a temperature difference efficiently to a heat source intended to be utilized and is installed, for example, to heat exhaustion apparatus, for example, electric power generation stations, or engine rooms of automobiles, etc.

The present invention is not restricted to the embodiments described above but includes various modifications. For example, the embodiments described above have been described specifically for easy explanation of the invention and are not always restricted to those having all of the configurations described above. Further, a portion of a configuration of a certain embodiment can be replaced with a configuration of other embodiment and a configuration of an embodiment may be modified by adding a configuration of other embodiment. Further, a portion of the configuration in each of the embodiments may be modified by addition, deletion, and replacement of other configuration.

LIST OF REFERENCE SIGNS 1 substrate
2 buffer layer
3 seed layer
10 non-magnetic Heusler alloy film
11 ferromagnetic Heusler alloy film
12 non-magnetic film
21 to 24 electrode
41 direction of magnetization
111 anti-ferromagnetic film
112 tunnel barrier film

The invention claimed is:

1. A thermoelectric conversion module having a plurality of thermoelectric conversion elements in each of which a first non-magnetic film, a ferromagnetic film, and a second non-magnetic film are stacked in this order over a substrate, the module comprising:
a first electrode pair formed over the second non-magnetic film for deriving a first electromotive force generated in a direction perpendicular to the direction of magnetization of the ferromagnetic film due to a temperature gradient parallel to the direction of magnetization of the ferromagnetic film; and
a second electrode pair for deriving a second electromotive force generated in a direction parallel to the direction of magnetization of the ferromagnetic film, and
wherein each of the plurality of the thermoelectric conversion elements are connected electrically in series such that the plurality of thermoelectric conversion elements are arranged to output, in series, electromotive forces generated in the plurality of thermoelectric conversion elements, wherein any two adjacent first and second thermoelectric conversion elements of the plurality of the thermoelectric conversion elements are connected between one electrode of the first plurality of electrodes of the first thermoelectric conversion element, and one electrode of the second plurality of electrodes of the second thermoelectric conversion element, and wherein the second non-magnetic film is in contact with the first electrode pair and is not in contact with the second electrode pair.

2. The thermoelectric conversion module according to claim 1, wherein the first non-magnetic film is a non-magnetic Heusler alloy film and the ferromagnetic film is a ferromagnetic Heusler alloy film.

3. The thermoelectric conversion module according to claim 1, wherein an anti-ferromagnetic film is provided for fixing the direction of magnetization of the ferromagnetic film in one direction and the ferromagnetic film is formed over the anti-ferromagnetic film.

4. The thermoelectric conversion module according to claim 1, wherein a tunnel barrier film is interposed between the second non-magnetic film and the first electrode pair.

5. The thermoelectric conversion module according to claim 2, wherein the element has a buffer layer and a seed layer formed over the buffer layer, and wherein the non-magnetic Heusler alloy film and the ferromagnetic Heusler alloy film each have a $B_2$ or $L2_1$ crystal structure and are stacked over the seed layer.

6. The thermoelectric conversion module according to claim 2, wherein the non-magnetic Heusler alloy film is $Fe_2TiSn$, $Fe_2VAl$, or $Fe_2VSi$.

7. The thermoelectric conversion module according to claim 1, wherein the first electromotive force is a spin-type Seebeck effect force, and the second electromotive force is a non-spin Seebeck effect force.

8. The thermoelectric conversion module according to claim 1, wherein said one electrode of the first plurality of electrodes is disposed at a corner of said first thermoelectric conversion module, and said one electrode of the second plurality of electrodes, which is connected with said one electrode of the first plurality of electrodes, is disposed at a diametrically opposite corner of the second thermoelectric conversion element with respect to said corner of said first thermoelectric conversion module.

* * * * *